United States Patent

Lundy et al.

[11] Patent Number: 5,952,153
[45] Date of Patent: Sep. 14, 1999

[54] PHOTOIMAGEABLE COMPOSITION HAVING IMPROVED FLEXIBILITY, ADHESION AND STRIPPING CHARACTERISTICS

[75] Inventors: Daniel E. Lundy, Placentia; Robert Barr, Laguna Niguel, both of Calif.

[73] Assignee: Morton International, Inc., Chicago, Ill.

[21] Appl. No.: 08/980,903

[22] Filed: Dec. 1, 1997

[51] Int. Cl.$^6$ ........................................ G03C 5/00
[52] U.S. Cl. ................... 430/281.1; 430/285.1; 430/920
[58] Field of Search ...................... 430/920, 325, 430/281.1, 285.1

[56] References Cited

U.S. PATENT DOCUMENTS

| | | | |
|---|---|---|---|
| 3,953,309 | 4/1976 | Gilano et al. | 204/159.16 |
| 4,003,877 | 1/1977 | Lipson et al. | 260/47 UA |
| 4,499,163 | 2/1985 | Ishimaru et al. | 430/5 |
| 4,610,951 | 9/1986 | Lipson et al. | 430/313 |
| 4,695,527 | 9/1987 | Geissler et al. | 430/256 |
| 4,756,994 | 7/1988 | Araki et al. | 430/281 |
| 4,952,482 | 8/1990 | Barton et al. | 430/325 |
| 5,217,845 | 6/1993 | Steppan et al. | 430/281 |

FOREIGN PATENT DOCUMENTS 0738927  4/1996  European Pat. Off. .

OTHER PUBLICATIONS

AB JP 61077844 A—Abstract of Japanese Invention, Derwent Abstract, Apr. 1986.
AB JP 07128851A—Abstract of Japanese Invention, Derwent Abstract, May 1995.
AB JP 09176253A—Abstract of Japanese Invention, Derwent Abstract, Jul. 1997.
AB JP 60240715A—Abstract of Japanese Invention, Derwent Abstract, Nov. 1985.

*Primary Examiner*—Janet Baxter
*Assistant Examiner*—Rosemary Ashton
*Attorney, Agent, or Firm*—Wayne E. Nacker; Gerald K. White

[57] ABSTRACT

A negative-acting photoimageable composition useful as a photoresist comprises an acid-functional binder, a photopolymerizable component, a photoinitiator chemical system comprising 9-phenyl acridine or a homologue thereof, and a dibenzoate plasticizer.

3 Claims, No Drawings

PHOTOIMAGEABLE COMPOSITION HAVING IMPROVED FLEXIBILITY, ADHESION AND STRIPPING CHARACTERISTICS

The present invention is directed to negative-acting photoimageable compositions such as those used as photoresists. The photoimageable composition uses 9-phenyl acridine or a homologue thereof as the photoinitiator, and the photoimageable composition is plasticized with a dibenzoate plasticizer.

BACKGROUND OF THE INVENTION

This invention is directed to negative-acting photoimageable compositions which are developable in alkaline aqueous solutions. The invention is particularly applicable to primary photoimaging resists, but is applicable, as well, to compositions that are hardenable so as to form solder masks and the like.

A variety of such photoimageable compositions are described. Essential components of compositions of the type to which the present invention is directed are A) a binder polymer; B) photopolymerizable $\alpha,\beta$-ethylenically unsaturated compound(s), and C) a photoinitiator chemical system. The binder polymer A) has sufficient acid functionality, generally carboxylic acid functionality, that the binder polymer is soluble in alkaline aqueous solution and thereby renders the photoimageable composition developable in alkaline aqueous solutions. The photoimageable compound(s) B) are monomers and/or short chain oligomers, a substantial portion of which are have multiple $\alpha,\beta$-ethylenic unsaturated functionality. Herein, the photoinitiator C), or at least a significant portion of the photoinitiator C) is 9-phenyl acridine or a homologue thereof.

SUMMARY OF THE INVENTION

In accordance with the present invention a negative-acting photoimageable composition comprises A) an organic polymeric binder having sufficient acid functionality to render the photoimageable composition developable in alkaline aqueous solution, B) an addition-polymerizable, non-gaseous ethylenically unsaturated compound(s) capable of forming a polymer by free-radical initiated chain-propagating addition polymerization, and C) an organic, radiation-sensitive free-radical generating system activatable by actinic radiation to initiate chain-propagating addition polymerization of the addition-polymerizable material, the free-radical generating system herein comprising 9-phenyl acridine or a homologue thereof, and D) a dibenzoate plasticizer

DETAILED DESCRIPTION OF CERTAIN PROFFERED EMBODIMENTS

Herein, unless otherwise noted, all percentages are weight percentages. Component A) (the binder polymer), Component B) (the photoimageable compounds(s)) and Component C) (the photoinitiator chemical system) are herein considered to equal 100 wt %, and other components, including the dibenzoate plasticizer, are calculated as parts relative to 100 parts of A) plus B) plus C).

The invention is directed to photoimageable compositions which are developable in alkaline aqueous solution and which therefore have substantial acid functionality. Such photoimageable compositions typically have a binder A) having acid functionality, typically an acid number of at least about 80, preferably at least about 100 and more preferably about 150 or more, up to about 250. The acid functionality is typically carboxylic acid functionality, but may also include, for example, sulfonic acid functionality or phosphoric acid functionality. Binder polymers for photoimageable compositions typically have weight average molecular weights between about 20,000 and about 200,000, preferably at least about 80,000.

The polymers are typically derived from a mixture of acid functional monomers and non-acid functional monomers. Some specific examples of suitable acid functional monomers are acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer.

The acid functional monomers may be copolymerized with non-acid functional monomers, such as esters of acrylic acids, for example, methyl acrylate, 2-ethyl hexyl acrylate, n-butyl acrylate, n-hexyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

The amount of the binder polymer A) may vary over a wide range, typically comprising between about 30 to about 80 wt % of the composition based on total weight of A) plus B) plus C).

Examples of such polymers and photoimageable compositions using such polymers are found, in the following U.S. Pat. Nos: 3,953,309, 4,003,877, 4,610,951, and 4,695,527 the teaching of each of which are incorporated herein by reference.

The photopolymerizable component B) is typically a monomer, dimer or short chain oligomer having ethylenic unsaturation, particularly, $\alpha,\beta$-ethylenic unsaturation, including monofunctional compounds and compounds having $\alpha,\beta$-ethylenic unsaturation functionality 2 or greater. Typically, a mixture of mono-functional and multi-functional monomers will be used. Suitable photopolymerizable compounds include, but are not limited to, the monomers recited above as suitable for forming binder polymers, particularly the non-acid functional compounds. The amount of photopolymerizable component B) is typically between about 19 and about 69 wt % of the photoimageable composition based on total weight of A) plus B) plus C).

To initiate polymerization of the monomers upon exposure to actinic radiation, the photoimageable composition contains a photoinitiator chemical system. In accordance with the invention, the photoinitiator chemical system is, or contains a significant proportion of, a 9-phenylacridine compound having the formula:

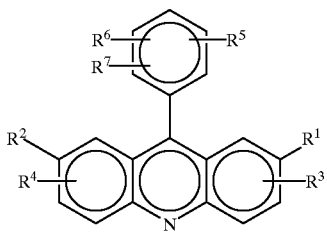

where $R^1$ and $R^2$ are the same or different and are selected from hydrogen, alkyl, substituted alkyl, acyl, and substituted acyl; $R^3$ and $R^4$ are the same or different and are selected from hydrogen, halogens, alkyl, substituted alkyl, acyl, and substituted acyl; and $R^5$, $R^6$ and $R^7$ are the same or different and are selected from hydrogen, halogens, alkyl, substituted alkyl, acyl, substituted acyl and groups of formula II:

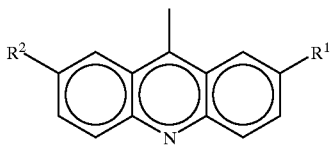

where $R^1$ and $R^2$ are as described above. Such compounds are described, for example, in U.S. Pat. No. 5,217,845, the teachings of which are incorporated herein by reference. From an availability standpoint, unsubstituted 9-phenyl acridine is the currently preferred photoinitiator. Of these, 9-phenyl acridine is the currently preferred initiator from a practical standpoint. Between about 0.05 wt % and about 2 wt %, preferably between about 0.1 and about 0.5 wt % of the photoimageable composition (based on total weight of A) plus B) plus C) is 9-phenyl acridine or a homologue of the general formula set forth above.

Such photoinitiators are used in the present invention because they tend to produce high cross-link densities. However, because of the high cross-link densities, the photoimageable compositions upon development become brittle. Photoresists are becoming required to tent ever larger through-holes in printed circuit boards, to which end brittleness is a significant detriment.

Therefore, photoimageable compositions in accordance with the invention are plasticized to improve flexibility, and herein, it is found that dibenzoate plasticizers in conjunction with the photoinitiators described above provide photoimageable compositions with good flexibility, fine line adhesion and stripping. Dibenzoate plasticizers in accordance with the invention have the general formula:

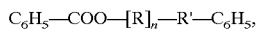
$C_6H_5$—COO—[R]$_n$—R'—$C_6H_5$, where

R=—$CH_2$—$CH_2$—O— and/or —$CH(CH_3)$—$CH_2$—O—; n=1 to 10, and

R' is —CHX—CHX—OOC— where both Xs are H or one X is H and the other is $CH_3$ or —OC—.

Specific examples of suitable dibenzoates include, but are not limited to dipropyleneglycol dibenzoate, diethylene glycol dibenzoate, polypropyleneglycol dibenzoate, and polyethylene glycol dibenzoate. The dibenzoate plasticizer D) is used at levels of between about 1 and about 8 wt % relative to total weight of A) plus B) plus C), typically at between about 2 and about 6 wt %.

Additionally, the photoimageable compositions may contain a wide variety of additional components as are known in the art, including additional polymers, such as those which might be used to effect a final hardened cure of a solder mask, dyes, stabilizers, flexibilizing agents, fillers etc.

Processing of the photoimageable composition is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper.

The invention provides a fine line (less than 75 microns) resist sidewall which adheres well to copper surfaces. It is believed that the dibenzoate plasticizer contributes a low overall glass transition temperature ($T_g$) to the photoimageable composition. The lower $T_g$ allows for better flow at lamination and better conformation to the copper surface. This property is particularly important on copper surfaces with nicks or scratches. Because a compositions with a dibenzoate plasticizer conforms better to a surface, more photoresist surface area is in contact with the surface. This results in more potential for chemical bonding to the copper surface and, therefore, improved adhesion properties. Because the dibenzoate plasticizer cannot incorporate into the backbone of the exposed acrylic monomer system, the inclusion of the dibenzoate plasticizer results in less overall shrinkage of the composition. This reduced shrinkage produces less stress on the copper/photoresist interface, contributing to the improved adhesion. Minimizing shrinkage is particularly important when using 9-phenyl acridine as the initiator because of the resulting high level of cross-link density.

The most surprising discovery was the improvement in stripping. Because the dibenzoate plasticizer produced better adhesion, stripping of the resist from the copper surface was expected to be more difficult. For example, the sidewall of the photoresists containing the dibenzoate plasticizer showed less attack in an alkaline-based developing solution. However, in the alkaline-based stripping solution, the dibenzoate-based systems stripped up to 20% faster. This is likely related to the ester functionality in the backbone and the way it orients the polymerized matrix of the photoresist composition.

The invention will now be described in greater detail by way of specific examples.

EXAMPLES 1–8 (1 and 6–8 comparative)

A base formulation is prepared having the following components:

TABLE "A"

Dibenzoate Patent Examples
Master Batch (without Plasticizer)

| Ingredient | Weight | Chemical Type |
|---|---|---|
| Acrylic Polymer (23% methacrylic acid, 66% methylmethacrylate, 11% butyl acrylate) | 40.0 grams | Polymer Backbone |
| Ethoxylated Trimethylolpropane Triacrylate | 24.0 grams | Monomer |
| Phenoxy Polyethoxy monoacrylate | 10.0 grams | Monomer |
| 9-phenylacridine | 0.2 grams | Initiator |
| Benzotriazole | 0.05 grams | Adhesion Promoter |
| Carboxybenzotriazole | 0.05 grams | Adhesion Promoter |
| Nitrated Azo Dye (Furon Navy) | .075 grams | Background Dye |
| Methyl Hydroquinone | .015 grams | Antioxidant |
| Triphenyl methane Dye (Flexoblue 680) | .045 grams | Background Dye |

To the base formula in Table A were added the additional ingredients set forth in Column 1 of Table B below.

All mixtures were prepared in 7:1 2-Butanone:2-Propanol at approximately 50% solids. The solutions were coated onto biaxially oriented 80 gauge polyester film and dried to approximately 1% or less retained solvent. The coated mixtures were then laminated onto mechanically scrubbed 1 oz./FR-4/1 oz. clad copper composite using a hot roll laminator at 110° C. at 2 meters/minute and 3 bar pressure.

The laminated material was then imaged on a UV printer through an appropriate phototool with an adjusted exposure to obtain a copper step of 7 as measured with a Stouffer® 21 step wedge (approximately 20 mJ/cm$^2$). The exposed panels were then developed in a 1% sodium carbonate monohydrate solution at 29° C. using a conveyorized spray developer at about 26 psi with residence time adjusted so that the break point occurred at 40% to 50% of the chamber length (unless otherwise noted in the specific example), followed by several spray rinses using tap water and the deionized water.

Etching was accomplished using a 2N cupric chloride/hydrochloric acid solution at 48° C. in a conveyorized etcher equipped with multiple spray nozzles. The etched boards were then stripped of the imaged, developed and etched photo resist in a 3% sodium hydroxide solution at 54° C. in a conveyorized stripping unit equipped with multiple spray nozzles followed by a spray rinse of tap water.

Process responses for the examples are cited at various points throughout the above procedure.

Processing results are shown in Columns 2–6 of Table B.

TABLE "B"

Effect of Plasticizer

| Ingredient | Fine Line Adhesion[1] | Sidewall Adhesion[2] | Cross Hatch Adhesion[3] | Tent Strength[4] | Strip Time[5] |
|---|---|---|---|---|---|
| 1. No Addition to Exhibit "A" | 80μ | Severe attack | 10% Intact | 350 grams | 52 seconds |
| 2. Diproplyene Glycol Dibenzoate | 50μ | no attack | 100% Intact | 500 grams | 34 seconds |
| 3. Diethylene Glycol Dibenzoate | 60μ | very slight attack | 100% Intact | 510 grams | 37 seconds |
| 4. Propylene Glycol Dibenzoate | 55μ | no attack | 100% Intact | 550 grams | 33 seconds |
| 5. Ethylene Glycol Dibenzoate | 55μ | no attack | 100% Intact | 550 grams | 30 seconds |
| 6. Diproplyene Glycol Monomethyl Ether benzoate | 70μ | slight attack | 100% Intact | 450 grams | 46 seconds |
| 7. Diacetone Acrylamide | 70μ | slight to moderate attack | 50% Intact | 380 grams | 65 seconds |
| 8. para toluene sulfonamide | 70μ | slight attack | 65% Intact | 440 grams | 60 seconds |

Note: Four grams of each listed plasticizer were added to ingredients listed in Table "A"

EXAMPLE 11 and Comparative Examples 9, 10 and 12

TABLE "C"

Dibenzoate Patent Examples
Master Batch (without Initiator or Plasticizer)

| Ingredient | Weight | Chemical Type |
|---|---|---|
| Acrylic Polymer (23% methacrylic acid 66% methylmethacrylate, 11% butyl acrylate) | 40.0 grams | Polymer Backbone |
| Ethoxylated Trimethylolpropane Triacrylate | 24.0 grams | Monomer |
| Phenoxy Polyethoxy monoacrylate | 10.0 grams | Monomer |
| Benzotriazole | 0.05 grams | Adhesion Promoter |
| Carboxybenzotnazole | 0.05 grams | Adhesion Promoter |
| Nitrated Azo Dye (Furon Navy) | .075 grams | Background |
| Methyl Hydroquinone | .015 grams | Antioxidant |
| Triphenyl methane Dye (Flexoblue 680) | .045 grams | Background Dye |

To the Master Batch of Table C were added ingredients listed in the first two columns of Table D below. Processing was as per Examples 1–8. Results are shown in Columns 3–7 of Table D below.

TABLE "D"

Combination with Phenyl Acridine

| Initiator Type | Plasicizer Typye | Fine Line Adhesion[1] | Sidewall Adhesion[2] | Cross Hatch Adhesion[3] | Tent Strength[4] | Strip Time[5] |
|---|---|---|---|---|---|---|
| 9. 0.5 grams isopropyl thioxanthone and 1.5 grams dimethylamino benzoate | 4.0 grams dipropylene glycol dibenzoate | 70μ | Moderate attack | 100% Intact | 500 grams | 51 seconds |
| 10. 0.5 grams isopropyl thioxanthone and 1.5 grams dimethylamino benzoate | 4.0 grams Diacetone acrylamide | 80μ | Moderate to severe attack | 80% Intact | 440 grams | 50 seconds |
| 11. 0.2 grams pbenyl acridine | 4.0 grams dipropylene glycol dibenzoate | 50μ | no attack | 100% Intact | 500 grams | 34 seconds |
| 12. 0.2 grams phenyl acndine | 4.0 grams Diacetone acrylamide | 70μ | slight attack | 50% Intact | 380 grams | 65 seconds |

Note: All ingredients below added to ingredients in Table "C"
Note 1 — Fine line adhesion measured after deveopment. It is the smallest line left adhering with a 400 micron space. The exposure was to a Stouffer 21 copper step 7 at a breakpoint in the developing chamber of 25%. Developing solution was 1% $Na_2CO_3$ at 30° C.
Note 2 — The degree of resist attack was observed after developing the photoresist in 1% $Na_2CO_3$ at 30° C. The exposure was to a Stouffer 21 copper step 7 at a breakpoint in the developing chamber of 25%.
Note 3 — Using a "razor blade like" tool, the developed photoresist is multiple cut in one direction than 90° to the previous cuts. This test measure brittleness and adhesion. The recording percentage is the percent of resist left intact after all the blade cuts (100% = Best). The exposure was to a Stouffer 21 copper step 7 at a breakpoint in the developing chamber of 25%. Developing solution was 1% $N_2CO_3$ at 30° C.
Note 4 — A 0.25 inch hole laminated on both sides with the photoresist. The resist is then exposed and developed (The exposure was to a Stouffer 21 copper step 7 at a breakpoint in the developing chamber of 25%. Developing solution was 1% $Na_2CO_3$ at 30° C.). The flexibility of the resist over this "tented" holes is then measured on a force gauge by pressing of the resist with a rounded probe. The force needed to break the tent is recorded in grams.
Note 5 — The resist is exposed to a Stouffer 21 copper step 7 at a breakpoint in the developing chamber of 25% with a developing solution of 1% $Na_2CO_3$ at 30° C. The resist is then etched in cupric chloride at 130° F. After etching, the photoresist is stripped in 3% NaOH at 130° F. and the time is recorded in seconds.

What is claimed is:

1. A negative-acting photoimageable composition comprising

A) between about 30 and about 80 wt % based on total weight of A) plus B) plus C) of a binder polymer having acid functionality sufficient to render said photoimageable composition developable in alkaline aqueous solution, B) between about 19 and about 69 wt % based on total weight of A) plus B) plus C) of an addition-polymerizable, non-gaseous ethylenically unsaturated compound(s) capable of forming a high polymer by free-radical initiated chain-propagating addition polymerization, C) a photoinitiator chemical system comprising between about 0.05 and about 2 wt % relative to total weight of A) plus B) plus C) of 9-phenyl acridine or a homologue thereof, and D) between about 1 and about 8 wt % calculated relative to total weight of A) plus B) plus C) of a dipropylene glycol dibenzoate.

2. The photoimageable composition according to claim 1 wherein said 9-phenyl acridine or homologue is present at between about 0.1 and about 0.5 wt %.

3. The photoimageable composition according to claim 1 wherein said dipropylene glycol wherein said dibenzoate dibenzoate is present at between about 2 and about 6 wt %.

* * * * *